United States Patent [19]

Feldman et al.

[11] 3,769,108

[45] Oct. 30, 1973

[54] MANUFACTURE OF BEAM-CROSSOVERS FOR INTEGRATED CIRCUITS

[75] Inventors: David Feldman, Allentown; Nathan George Lesh, Bethlehem; Walter Worobey, Center Valley, all of Pa.

[73] Assignee: Bell Telephone Laboratories, Incorporated, Murray Hill, N.J.

[22] Filed: Dec. 3, 1971

[21] Appl. No.: 204,546

[52] U.S. Cl. .................... 156/3, 156/17, 29/25.42, 29/424, 29/578, 29/591, 317/234 N

[51] Int. Cl. .................... H05k 3/06

[58] Field of Search .................... 29/574, 628, 625, 29/423, 424, 25.42; 156/17

[56] References Cited

UNITED STATES PATENTS 3,575,822 4/1971 Limbourg .................... 29/424

3,461,524 8/1969 Lepselter .................... 29/25.42

*Primary Examiner*—J. Steinberg

*Attorney*—W. L. Keefauver et al.

[57] ABSTRACT

A prefabricated substrate for forming hybrid integrated circuits utilizes nests of prefabricated beam crossovers. Standardized masks are utilized for forming the beam crossover nests at fixed locations on the substrate. The metal spacing and support layer is retained under the beam crossovers while the subsequent pattern generation steps, such as defining the interconnection conductor pattern, are completed and the layer is then removed. Integrated circuit chips and lead frames are then mounted on the substrate to complete the hybrid integrated circuit.

3 Claims, 9 Drawing Figures

MANUFACTURE OF BEAM-CROSSOVERS FOR INTEGRATED CIRCUITS

BACKGROUND OF THE INVENTION

1. Field of the Invention

This invention relates to integrated circuits and more particularly to the manufacture of hybrid integrated circuits utilizing a prefabricated substrate having nests of prefabricated beam crossovers in standardized locations thereon.

2. Description of the Prior Art

Hybrid integrated circuits are formed by bonding separately formed units such as silicon integrated circuit chips and lead frames to substrates having an interconnection pattern including conductors and beam crossovers already formed thereon by film integrated circuit techniques. Apparently, there has been little effort toward standardizing the layout of such hybrid integrated circuits and accordingly, the layout of the conductor pattern and beam crossovers interconnecting the silicon integrated circuit chips is unique or custom designed for each different hybrid integrated circuit.

Presently, the formation of the interconnection pattern including the interconnecting conductors and beam crossovers is accomplished on a metallized substrate by the general steps of: (1) defining the conductor pattern including the conductors under the beam crossovers; (2) forming pillar holes for the beam crossovers; and (3) defining the beam crossovers. The defining of beam crossovers is performed as the last step in the procedure because heretofore these fragile beam crossovers have not been able to withstand the rigors of any subsequent processing. Thus, no prefabrication of beam crossovers has been deemed feasible. Each of these above steps requires a custom mask for each different hybrid integrated circuit because of the random placing of the conductors, beam crossovers, etc., as previously mentioned. This requirement of three unique or custom masks for defining the interconnection pattern, including the beam crossovers, for each different hybrid integrated circuit significantly increases the cost and time required for fabricating hybrid integrated circuits. In many instances the fabrication of low volume hybrid integrated circuits such as for experimental use is not feasible. Further, each different hybrid integrated circuit requires custom designed test apparatus because of the unique layout for each of such hybrid integrated circuits.

Accordingly, it is an object of this invention to standardize the layout of hybrid integrated circuits and thereby simplify the manufacture and testing of such circuits.

Another object is to reduce the number of custom masks required in the fabrication of hybrid integrated circuits and thereby reduce the cost and time required for fabricating such circuits.

SUMMARY OF THE INVENTION

The foregoing objects and others are achieved in accordance with the invention by the use of a standardized or prefabricated substrate having nests of prefabricated beam crossovers thereon at fixed locations. The nests of beam crossovers are formed as the initial pattern generation step on a metallized substrate. The metal spacing layer, including the copper layer, is retained under the beam crossovers for support during the subsequent definition of the remainder of the interconnection pattern comprising the pattern of conductors. A single set of four masks is used to define the nests of beam crossovers for all different types of hybrid integrated circuits and thus only a single custom mask is required to subsequently define the conductor pattern for a particular hybrid integrated circuit. The metal spacing and support layer is removed by selective etching after the completion of the definition of the interconnection pattern.

Silicon integrated circuit chips and lead frames are mounted in fixed locations on the substrate having the prefabricated beam crossovers and the conductor pattern thereon. Accordingly, standardized or common test fixtures can be utilized for testing the many different types of completed hybrid integrated circuits.

BRIEF DESCRIPTION OF THE DRAWING

The invention will be more fully comprehended from the following detailed description and accompanying drawing in which:

FIGS. 3A through 3F are substantially similar to a view along direction 3—3 of FIG. 2 except that only one underlying conductor is shown for clarity.

DETAILED DESCRIPTION

Figure 1:
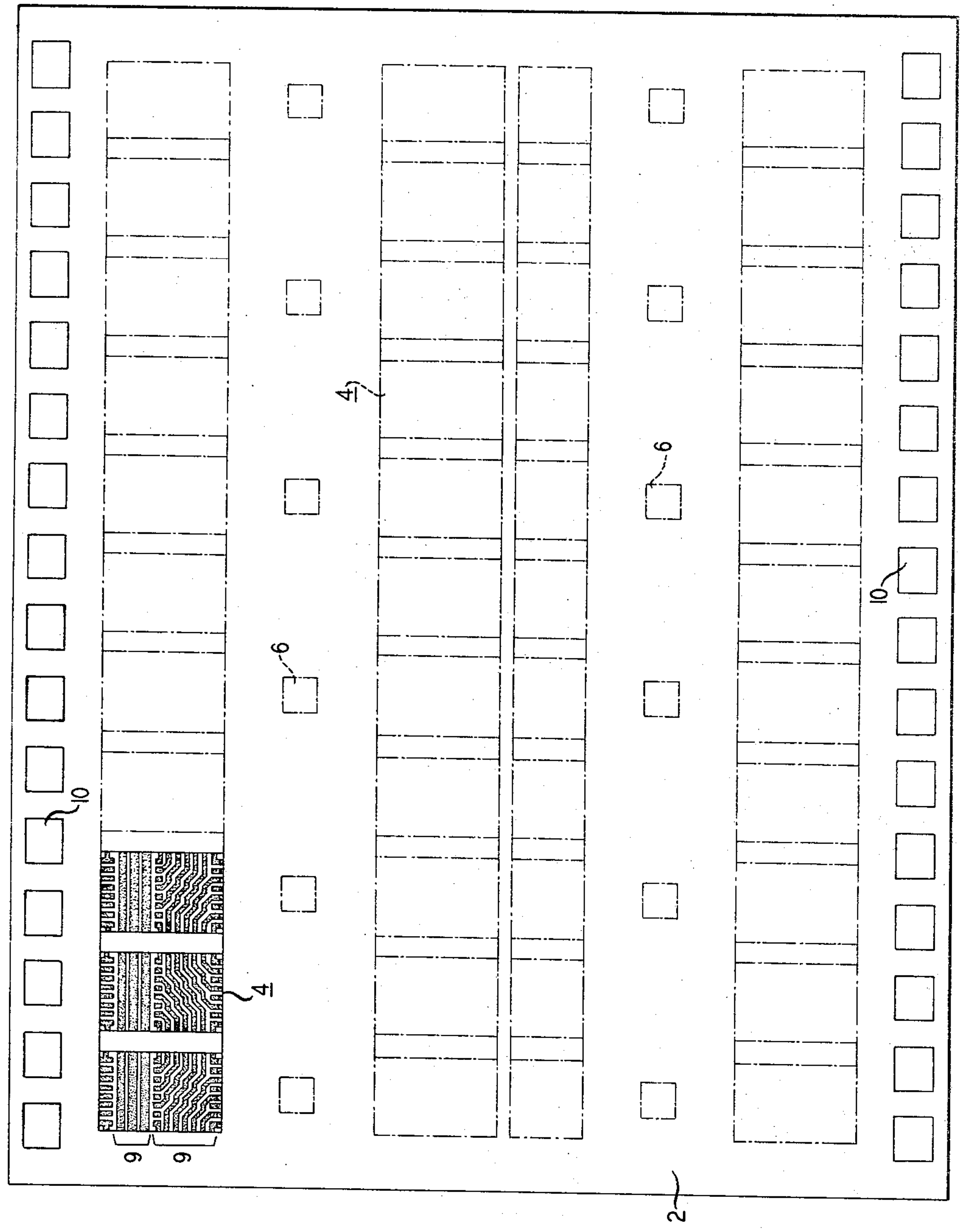
FIG. 1 is a representation of a substrate having nests of prefabricated beam crossovers in accordance with this invention.
Figure 2:
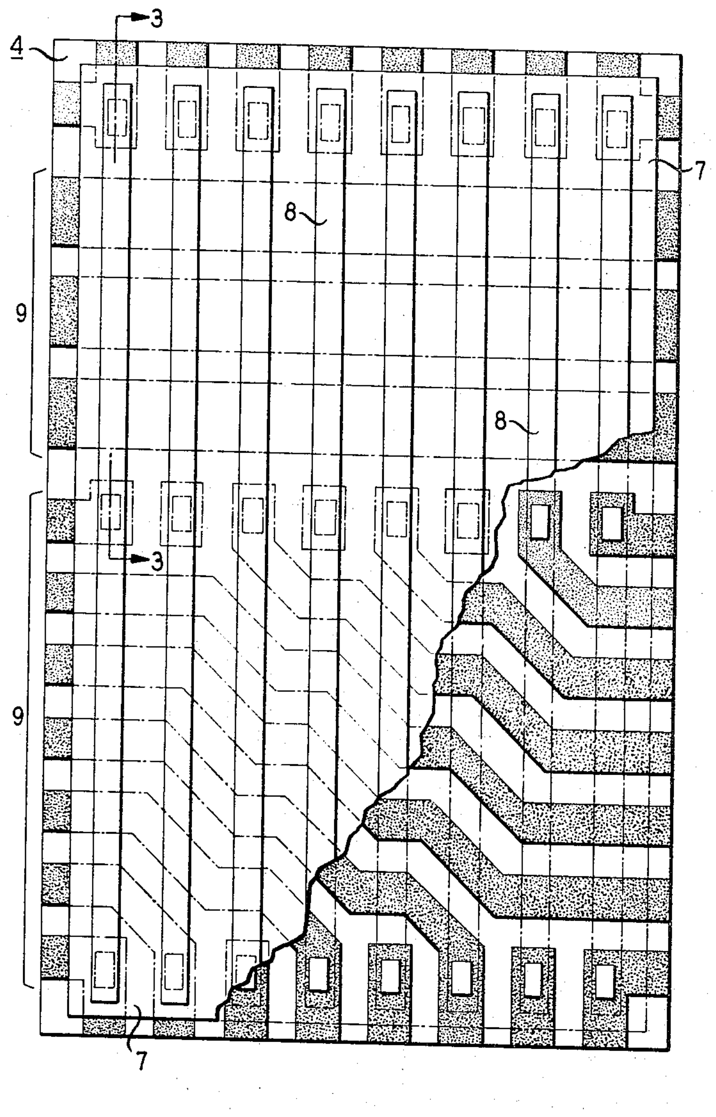
FIG. 2 is an enlarged representation of a single nest of beam crossovers utilized on the substrate of FIG. 1.

Referring now to FIG. 1 there is shown a substrate 2 having formed thereon a plurality of nests 4 of prefabricated beam crossovers and designated sites 6 at which silicon integrated circuit chips will subsequently be mounted. In FIG. 1 the beam crossover and spacing layers of the nests 4 are shown removed to expose the underlying conductors 9. Substrate 2 also contains a plurality of termination pads 10 for subsequently interconnecting the substrate with other apparatus. As shown more clearly in FIG. 2, each nest 4 includes a plurality of beam crossovers 8 crossing underlying conductors 9. Beam crossovers 8 and underlying conductors 9 are separated by a layer 7, which normally comprises copper, as will be subsequently explained more fully. Interconnections between the silicon integrated circuit chips and between the chips and termination pads 10 are effected through the nests 4 of beam crossovers. Each nest 4 contains the same layout of beam crossovers 8 and only those required in a particular nest are used.

The locations of beam crossover nests 4 and silicon integrated circuit chip sites 6 are fixed for all types of hybrid integrated circuits. Interconnection between any desired silicon integrated circuit chips or between any silicon integrated circuit chip and any termination pad 10 can be made through various combinations of beam crossovers 8 and conductors which are to be formed on the substrate later. Accordingly, the location of test points for testing the hybrid integrated circuits can also be predesignated and a common test fixture can be utilized for testing many types of hybrid integrated circuits.

Figure 3A:
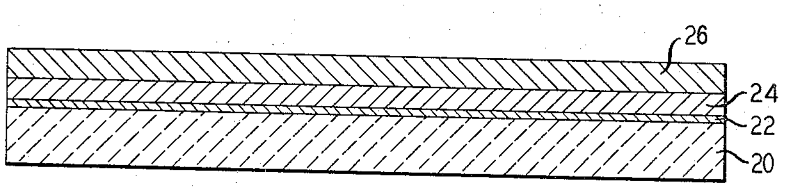
FIGS. 3A, 3B, 3C, 3D, 3E, and 3F are sectional schematic representations of a prefabricated beam crossover at various stages during its fabrication.
Figure 3B:
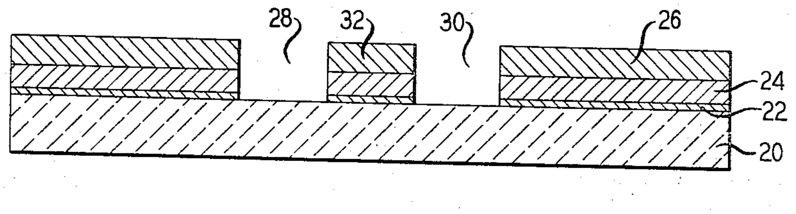

The beam crossovers 8 in nests 4 are formed on substrate 2 over underlying conductors 9 as is schematically represented in FIGS. 3A through 3F. FIG. 3A illustrates the initial metallization of a substrate 20 by the formation thereon of successive metal layers such as layers of titanium 22, palladium 24 and gold 26 by well-known techniques such as vapor deposition or sputtering. Openings 28 and 30 are then etched in the metallized substrate by well-known masking and etching techniques at the desired locations to define the underlying or bottom conductors 32 of the beam crossover nests as shown in FIG. 3B. The beam crossovers will subsequently be formed over these bottom conductors 32. This definition of the bottom conductors 32 requires one mask.

Figure 3C:
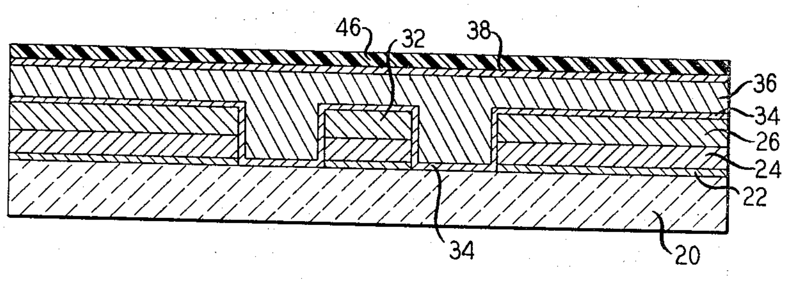
Figure 3D:
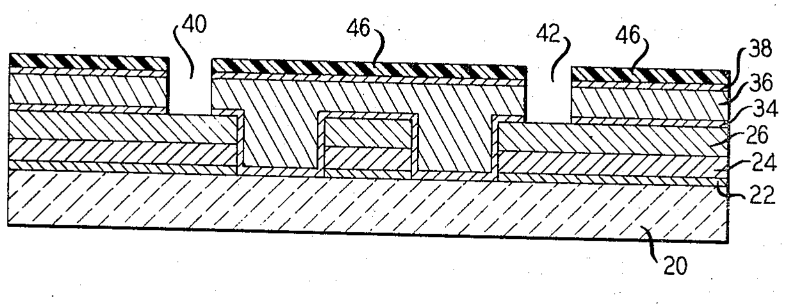
Figure 3E:
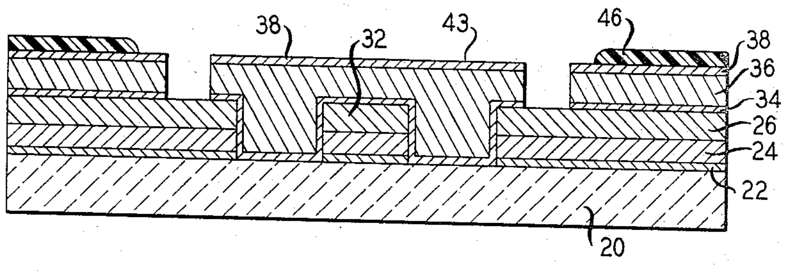
Figure 3F:
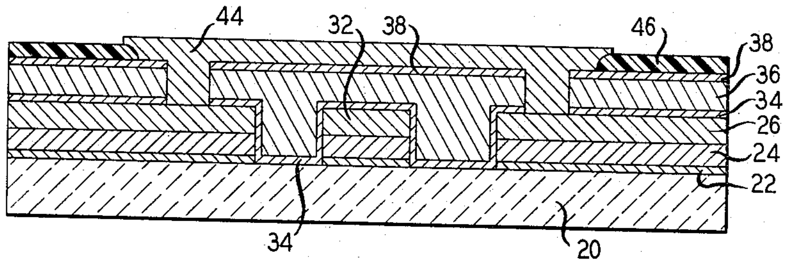

Following the delineation of bottom conductors 32 additional layers of metal such as layers of titanium 34, copper 36 and nickel 38 are formed over the entire substrate, or alternatively are selectively formed in the crossover nest regions, as shown in FIG. 3C by the previously mentioned sputtering or vapor deposition techniques and covered with a photoresist layer 46. Subsequently, as shown in FIG. 3D, the pillar holes 40 and 42 for the beam crossover are etched through photoresist layer 46 in the metal layers 34, 36 and 38 utilizing a second mask and known etching techniques. The beam crossover path 43 is then defined in the overlaying photoresist layer 46 utilizing a third mask and the beam crossover 44 is then formed by gold plating the previously defined path 43 as shown in FIGS. 3E and 3F, respectively. Heretofore, the titanium, copper, and nickel spacing layers 34, 36, and 38, respectively, have been removed after formation of the beam crossover 44. According to applicants' invention these layers are temporarily left beneath beam crossover 44 for support during the subsequent processing steps. This retention of metal layers 34, 36 and 38 for support allows the beam crossover to be prefabricated on substrate 20 which has not been possible previously. From the foregoing it is apparent that a prefabricated or standardized substrate having prefabricated beam crossovers thereon can be made on an assembly line basis with only three masks. A fourth mask is used to delineate the various nests after the completion of the formation of the beam crossovers if the spacing layer has been formed over the entire substrate. These four masks can be common to all different hybrid integrated circuit designs.

Figure 4:
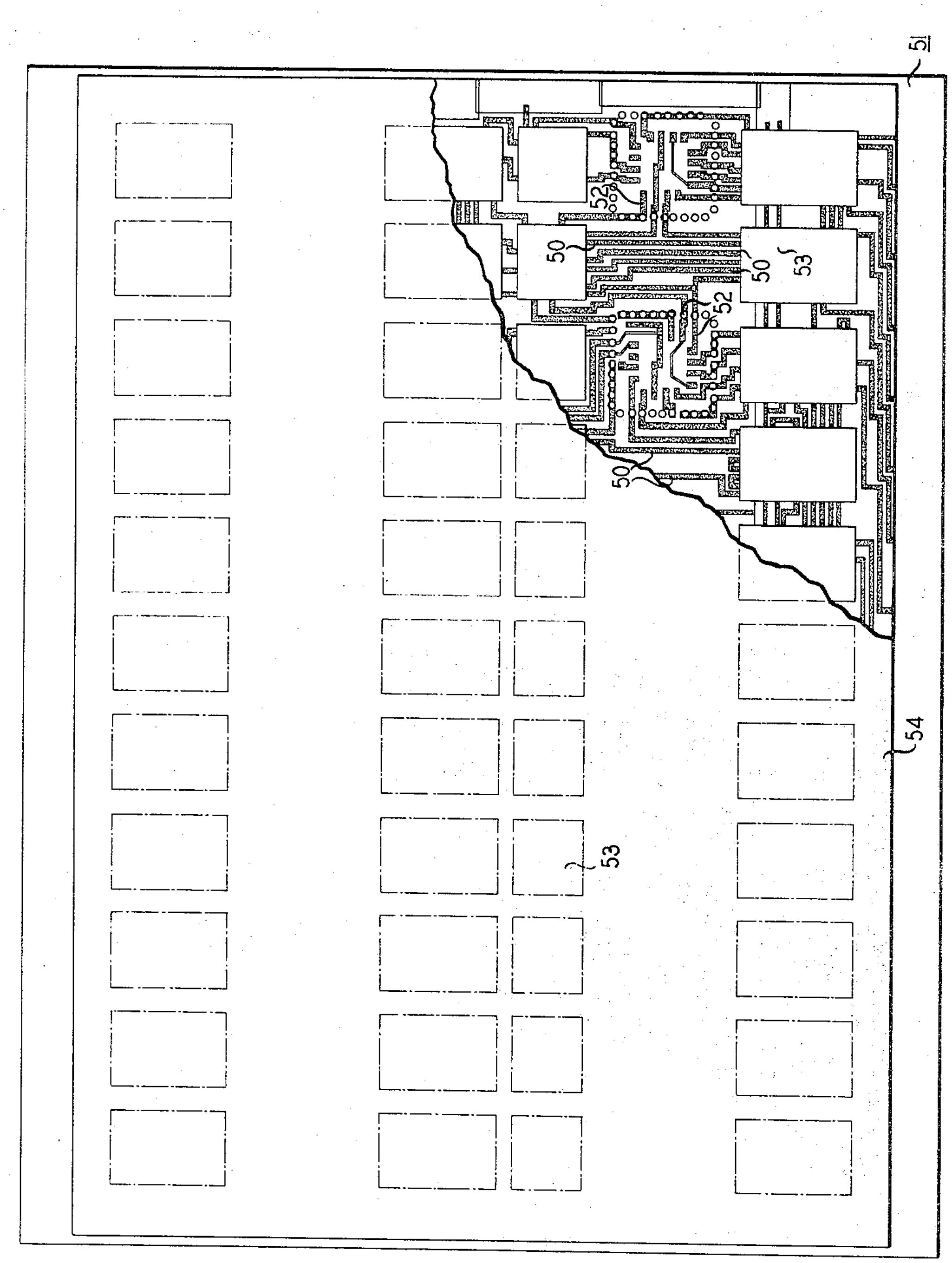
FIG. 4 is a schematic representation of a mask for defining the remainder of the interconnection pattern including the conductor pattern on the substrate of FIG. 1.

When it is desired to subsequently utilize a substrate 2 in fabricating a particular hybrid integrated circuit design, it is necessary to generate only one custom mask for the particular design. Such a mask 51 shown in FIG. 4 defines the interconnecting conductor pattern 50 and the bonding pattern 52 for the locations where silicon integrated circuit chips are to be mounted. The conductor pattern 50 and bonding pattern 52 are then formed on substrate 2 by standard masking and etching techniques. Mask 51 also contains portions 53 and 54, respectively, for protecting the crossover nests 4 and termination pads 10 during the formation of patterns 50 and 52.

After the formation of interconnecting conductor and bonding patterns 50 and 52, respectively, the nickel, copper and titanium supporting layers 38, 36 and 34, respectively, which had been retained in the crossover nests, are removed from beneath the beam crossovers 8 by selective etching and the crossovers 8 are tested. Subsequently the silicon integrated circuit chips and the lead frames are bonded to the substrate 2 at the predesignated locations being utilized and the entire hybrid integrated circuit can then be tested utilizing test fixtures common to the testing of many different hybrid integrated circuits.

It is apparent from the foregoing that the utilization of standard substrates and the reduction of the number of custom masks to only one such mask for any particular hybrid integrated circuit will allow low volume hybrid integrated circuits to be economically fabricated. Further, because of the standardization of the basic substrate design assembly line techniques can be readily utilized in fabricating the substrates with beam crossovers.

Although the invention has been described with respect to specific embodiments thereof it is to be understood that various modifications thereto might be made by those skilled in the art without departing from the spirit and scope of the following claims.

What is claimed is:

1. The method of fabricating beam cross-overs for integrated circuits on a substrate comprising the steps of:

forming a first conductor on said substrate;

deposting a supporting layer of etchable material on top of said first conductor;

forming a second conductor over said supporting layer including a crossover region with respect to said first conductor, said second conductor having insufficient strength in said crossover region to withstand subsequent processing steps in the absence of said supporting layer;

forming a pattern of interconnecting conductors on said substrate while masking said cross-over region to retain said supporting layer beneath said second conductor to provide strength thereto; and removing said supporting layer by selectively etching said material therein after said subsequent processing steps are completed whereby beam crossovers can be fabricated on said substrate as the initial step in said method.

2. The method of claim 1 wherein:

said first conductor comprises a composite layer including films of titanium, palladium and gold;

said supporting layer comprises a composite layer including films of titanium and copper; and said second conductor comprises a layer of gold.

3. The method of fabricating beam cross-overs for integrated circuits on a substrate comprising the steps of forming a pattern of first conductors on said substrate, depositing a layer of etchable material on top of said first conductors, and forming a pattern of second conductors over said layer, said second conductors including crossover regions with respect to said first conductors, said second conductors having insufficient strength in said crossover regions to withstand subsequent processing steps in said method; characterized in that said method includes:

completing said subsequent processing steps while masking said cross over regions to retain said layer of material in said crossover regions to support said second conductors; and removing said supporting layer in said crossover regions by etching after said subsequent processing steps are completed to leave said first and second conductors in spaced relationship in said crossover regions, whereby beam crossovers can be fabricated as the initial step in said method.

* * * * *